United States Patent [19]

Kamuro

[11] Patent Number: 4,952,824

[45] Date of Patent: Aug. 28, 1990

[54] ION IMPLANTATION PROGRAMMABLE LOGIC DEVICE

[75] Inventor: Setsufumi Kamuro, Matsudo, Japan

[73] Assignee: Sharp Kabushiki Kaisha, Osaka, Japan

[21] Appl. No.: 255,450

[22] Filed: Oct. 7, 1988

[30] Foreign Application Priority Data

Oct. 7, 1987 [JP] Japan .................................. 62-253044

[51] Int. Cl.⁵ ........................................ H63K 19/177
[52] U.S. Cl. .................................... 307/469; 307/465; 307/303.2
[58] Field of Search ................. 307/443, 465, 468–469, 307/451–452, 272.2, 303.2; 364/716

[56] References Cited

U.S. PATENT DOCUMENTS

| 4,032,894 | 6/1977 | Williams | 307/468 X |
| 4,124,899 | 11/1978 | Birkner et al. | 307/465 |
| 4,431,928 | 2/1984 | Skokan | 307/465 |
| 4,644,191 | 2/1987 | Fisher et al. | 307/465 |
| 4,689,654 | 8/1987 | Brockmann | 307/465 X |
| 4,703,206 | 10/1987 | Cavlan | 307/465 |
| 4,717,844 | 1/1988 | Shima et al. | 364/716 X |
| 4,772,811 | 9/1988 | Fujioka et al. | 307/465 |

Primary Examiner—David Hudspeth

[57] ABSTRACT

A programmable logic device includes logic cells with input signal circuits for each of the logic cells. In the input circuits first MOS transistors are connected in series or parallel and one end of each of the input signal circuits is connected to one of the inputs of the logic cells. There are also signal lines, each of which interconnects the gates of the first transistors. Output signal circuits have second MOS transistors, each of which is connected to the signal lines, the gates of the second transistors being connected to the outputs of the logic cells. The channels of the first and second transistors can be ion-implanted so that the threshold level of the MOS transistors can be changed.

10 Claims, 4 Drawing Sheets

ION IMPLANTATION PROGRAMMABLE LOGIC DEVICE

BACKGROUND OF THE INVENTION

1. Field of the Invention

This invention relates to circuit configurations and the technological process for obtaining logic LSIs which can be used in various kinds of applications, and, more particularly, relates to programmable logic devices (PLDs).

2. Description of the Prior Art

Gate arrays and PLDs are used as logic LSIs which can be manufactured to a certain stage with the same process steps regardless of their individual application, and the circuit of each of which can be modified in accordance with the individual application.

Generally, gate arrays are manufactured with the same steps to the stage preceding the steps in which metal layers are formed, and thereafter three steps of forming two metal layers and contact holes (also called through holes, or vias) connecting the two metal layers with each other are performed using masks which are specially patterned to comply with the requirements of individual application, thereby obtaining logic LSIs each of which conforms with the individual application.

A PLD generally comprises an AND array for obtaining a logical product (AND) of input signals from a plurality of inputs, and an OR array for obtaining a logical sum (OR) of signals on the output lines of the AND array. The outputs of the OR array are transmitted as output signals of the PLD. In some PLDs, a part of the outputs of the OR array is sent to flip-flops the output of which is fed back to the input of the AND array. The logic of both or either of the AND and OR arrays can be set in accordance with the purpose of the PLD. In many cases, the logics of the AND array and OR array are set by disconnecting fusible metal links.

When manufacturing a conventional gate array, photomasks for three process steps (i.e., the formations of the first metal layer, the second metal layer and the contact holes connecting the two metal layers) are required for each application. Such metal steps should be followed by other process steps. As a result, many working hours are necessary for preparing three photomasks and performing the other process steps, causing the problem that the market requirement of the short period of delivery cannot be satisfied.

As described above, in conventional PLDs, logics are realized only by combining AND arrays and OR arrays so that rather complicated logics are difficult to realize, resulting in impaired flexibility of realizing logics.

SUMMARY OF THE INVENTION

A programmable logic device of this invention, overcomes the above-discussed and numerous other disadvantages and deficiencies of the prior art, includes one or more logic cells having one or more inputs and one or more outputs. There are one or more input signal circuits for each of said logic cells, said input signal circuits having first MOS transistors connected in series, and one end of each of said input signal circuits being connected to one of said inputs of said logic cells. Signal lines each of which interconnects the gates of corresponding ones of said MOS transistors. Load elements are placed between each of said signal lines and one voltage level; and one or most output signal circuits having second MOS transistors each of which is placed between another voltage level and one of said signal lines, respectively. The gates of said second MOS transistors are connected to said outputs of said logic cell.

In a preferred embodiment, both said first and second MOS transistors are NMOS transistors.

In a preferred embodiment, both said first and second MOS transistors are PMOS transistors.

In a preferred embodiment, it is possible to ion-implant the channel of each of said first and second MOS transistors, thereby enabling the threshold level of said first and second MOS transistors.

In a preferred embodiment, no metal layer is disposed above both said first and second MOS transistors.

A programmable logic device of this invention includes one or more logic cells having one or more inputs and one or more outputs. There are one or more input signal circuits for each of the logic cells, the input signal circuits including first MOS transistors of one type connected in parallel, and one end of each of said input signal circuits being connected to one of said inputs of said logic cells. Signal lines each of which interconnects the gates of corresponding ones of said first MOS transistors; load elements placed between each of said signal lines and one voltage level. There is also one or more output signal circuits having second MOS transistors of the opposite type each of which is disposed between another voltage level and one of said signal lines, respectively, the gates of said second MOS transistors being connected to said outputs of said logic cell.

In a preferred embodiment, said first MOS transistors are of the N-type, and said second MOS transistors are of the P-type.

In a preferred embodiment, said first MOS transistors are the P-type, and said second MOS transistors are the N-type.

In a preferred embodiment, it is possible to ion-implant the channel of each of said first and second MOS transistors, thereby enabling the threshold level of said first and second MOS transistors.

In a preferred embodiment, no metal layer is disposed above both said first and second MOS transistors.

Thus, the invention described herein makes possible the objectives of (1) providing PLDs which can be manufactured using less photomasks; (2) providing PLDs which can be manufactured in reduced processing hours which are necessary after the metal steps; (3) providing PLDs which can result in more complex logics than conventional PLDs.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
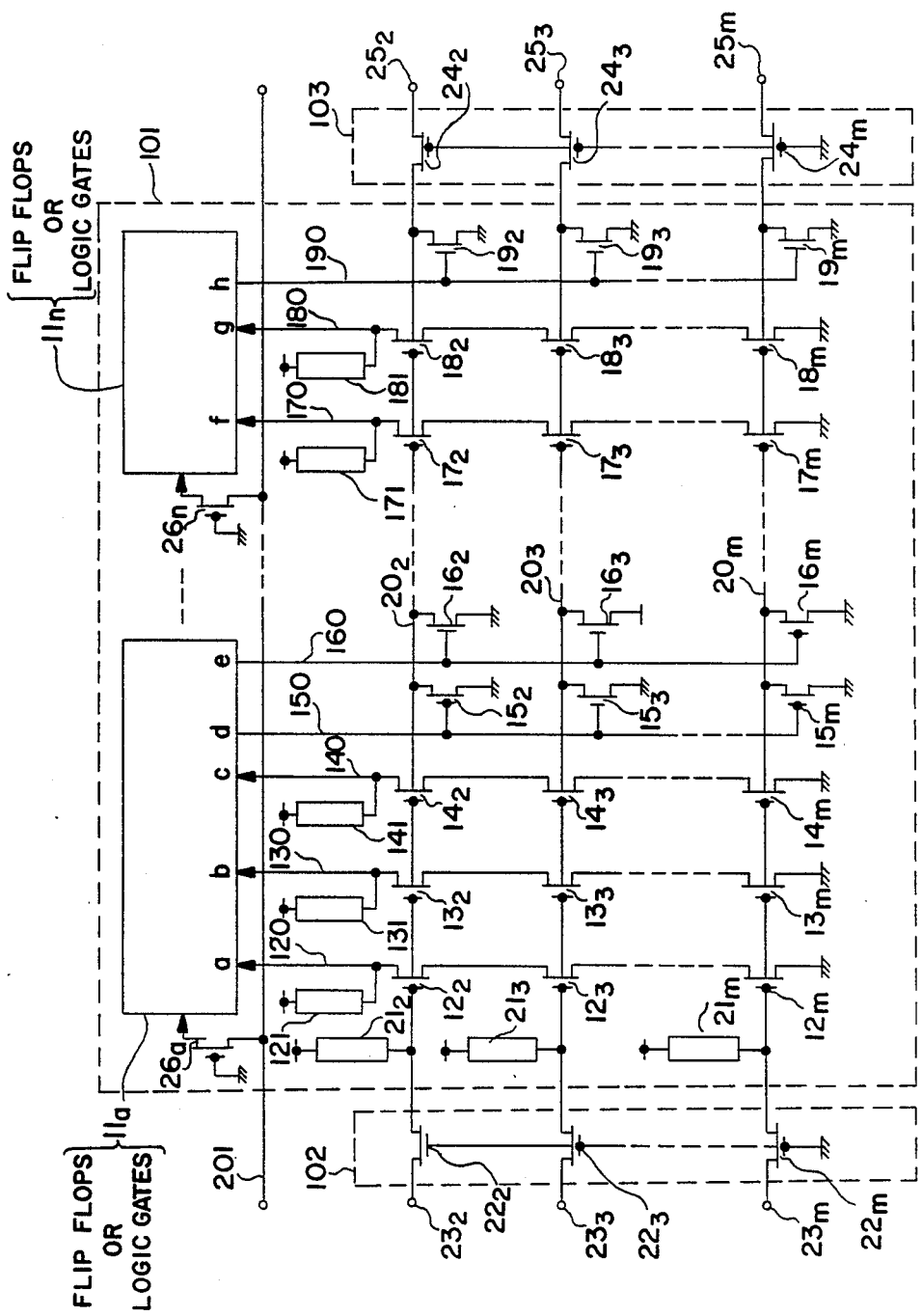
FIG. 1 is a circuit diagram of a PLD according to the invention.

FIG. 1 illustrates an example of the PLD according to the invention. The PLD of FIG. 1 comprises a logic block 101, and two switch blocks 102, 103 for setting the connections between the logic block 101 and other logic blocks (not shown). The logic block 101 comprises logic cells $11_0$–$11_n$ which are flip-flops or logic gates having one or more inputs and one or more outputs. All of the MOS transistors shown in FIG. 1 excepting those in the logic cells $11_0$–$11_n$ are NMOS transistors. The functions of the logic cells $11_0$–$11_n$ may be adequately selected. The logic of each logic cell may be previously set. For example, the cell $11_0$ is a D-type flip-flop the cell $11_1$ is an RS-type flip-flop, and the cells $11_2$–$11_n$ are four-input NAND gates. Alternatively, the logic of each cell need not be previously set, and may be fixed by implanting ion into the channels of given MOS transistors in the logic cells. The logic cell $11_0$ shown in FIG. 1 has three inputs a, b and c and two outputs d and e, but the numbers of the inputs and outputs of logic cells useful in the invention can be selected dependent on use. The logic cell $11_n$ has two inputs f and g and one output h.

Figure 2:
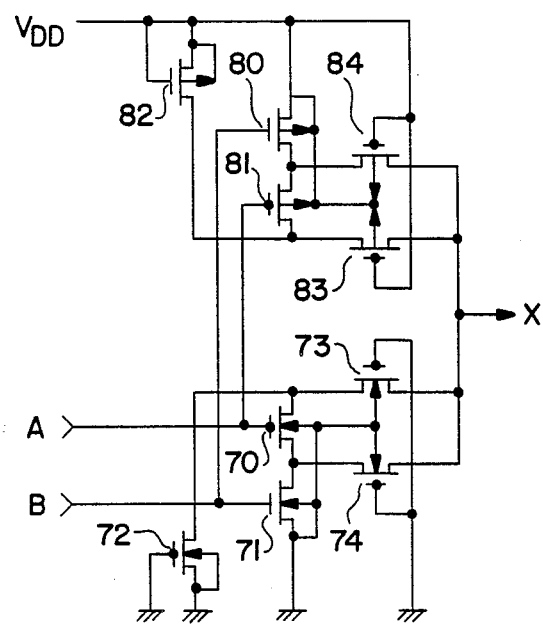
FIG. 2 is a circuit diagram of a logic cell in the PLD of FIG. 1.

FIG. 2 shows an example of the circuit configuration of the logic cells. The circuit of FIG. 2 can be set to a NAND gate or a NOR gate by selectively forming depletion type MOS transistors as summarized in Table 1 wherein "E" means an enhancement type MOS transistor and "D" a depletion type MOS transistor.

TABLE 1

| Logic | NMOS Transistor | | | | | PMOS Transistor | | | | |
|---|---|---|---|---|---|---|---|---|---|---|
| | 70 | 71 | 72 | 73 | 74 | 80 | 81 | 82 | 83 | 84 |
| NAND | E | E | E | D | E | E | E | D | E | D |
| NOR | E | E | D | E | D | E | E | E | D | E |

In FIG. 1, the power supply and grounding connections for the logic cells $11_0$–$11_n$ are not shown. When signals, such as a clock signal are necessary for the logic cells, lines dedicated to the purpose may be formed without departing the spirit of the invention. In the PLD of FIG. 1, a special signal line 201 is formed to supply a common signal such as a clock signal to one or more of the logic cells. Two or more special signal lines may be formed. When a signal on the special signal line 201 is to be supplied to a logic cell $11_i$, the NMOS transistor $26_i$ connected to the logic cell $11_i$ is formed by the ion-implantation so that the NMOS transistors $26_i$ becomes the depletion type to be at the normally-on state. Among the NMOS transistors $26_0$–$26_n$ connected to the special signal line 201, those which are not ion-implanted are of the enhancement type and at the normally off state since the gates thereof are at the power source.

Load elements $21_2$–$21_m$ are located between signal lines $20_2$–$20_m$ and the power source. These load elements may consist of enhancement type MOS transistors, depletion type MOS transistors, polysilicon high resistance elements or the like. The effective level of the signal lines $20_2$–$20_m$ is a low level, and the non-effective level thereof is a high level.

At the input sides of the logic cell $11_0$, three NMOS transistor groups $12_2$–$12_m$, $13_2$–$13_m$ and $14_2$–$14_m$ are disposed. The gates of the corresponding NMOS transistors in each groups are connected to the signal lines $20_2$–$20_m$, respectively. The drains of the NMOS transistors, $12_2$, $13_2$, and $14_2$ are connected to the inputs a–c, respectively. The sources of the NMOS transistors $12_m$, $13_m$ and $14_m$ are grounded. The NMOS transistors in each group are disposed in series by, as shown in FIG. 1, sequentially connecting the drain of one NMOS transistor (e.g., $12_{i-1}$) with the source of another NMOS transistor ($12_i$). The load elements $12_1$, $13_1$ and $14_1$ are connected to drains of the NMOS transistors $12_2$, $13_2$ and $14_2$. The signals 120, 130 and 140 from the NMOS transistor groups are supplied to the logic cell $11_0$ as input signals. At the output sides of the logic cell $11_0$, two NMOS transistor groups $15_2$–$15_m$ and $16_2$–$16_m$ are disposed.

An output line 150 interconnects the gates of NMOS transistors $15_2$–$15_m$. The drains of the NMOS transistors $15_2$–$15_m$ are connected to the signal lines $20_2$–$20_m$. Another output line 160 interconnects the gates of NMOS transistors $16_2$–$16_m$ the sources of which are grounded. The drains of the corresponding NMOS transistors $15_2$–$15_m$ and $16_2$–$15_m$ constituting each transistor group are connected to the signal lines $20_2$–$20_m$, respectively.

Similarly, at the input side of the logic cell $11_n$, there are two transistor groups $17_2$–$17_m$ and $18_2$–$18_m$ connected in series, and load elements 171 and 181. The gates of the corresponding NMOS transistors in each group are connected to the signal lines $20_2$–$20_m$. At the output side, an output line 190 interconnects the gates of NMOS transistors $19_2$–$19_m$. The drains of the NMOS transistors $19_2$–$19_m$ are connected to the signal lines $20_2$–$20_m$, respectively.

The switch blocks 102 and 103 include NMOS transistors $22_2$–$22_m$ and $24_2$–$24_m$ which are connected to the signal lines $20_2$–$20_m$ and signal lines $23_2$–$23_m$ and $25_2$–$25_m$, respectively, as shown in FIG. 1.

Among the NMOS transistors $12_2$–$12_m$, $13_2$–$13_m$ and $14_2$–$14_m$ at the input side of the logic cell $11_0$, those which are not required to turn on/off in response to the signal level of the signal lines $20_2$–$20_m$ are ion-implanted to become the depletion type. Hereinafter, such transistors are also referred "unselected transistors". The remaining NMOS transistors of the three transistor groups are of the enhancement type (hereinafter, such transistors are also referred "selected transistors"). For example, the NMOS transistor $12_2$ is a selected MOS transistor (enhancement type), and the other NMOS transistors $12_3$–$12_m$ of the same transistor group are unselected MOS transistors (depletion type). Irrespective of the levels of the signal lines $20_3$–$20_m$, the NMOS transistors $12_3$–$12_m$ remain on. When the signal line $20_2$ is at the non-effective level (high level), the NMOS transistor $12_2$ is on, and the input signal 120 is at a low level. Conversely, when the signal line $20_2$ is at the effective level (low level), the NMOS transistor $12_2$ is off, and the input signal 120 is at a high level.

Among the NMOS transistors $15_2$–$15_m$ and $16_2$–$16_m$ the gates of which are connected to the outputs d and e of the logic cell $11_0$ through the output lines 150 and 160, those which are necessary for transmitting signals to the signal lines $20_2$–$20_m$ are formed into the enhancement type (i.e., selected transistors), and the remaining transistors (i.e., unselected transistors) are implanted by a suitable impurity to become the normally-off state with a high threshold voltage. For example, only the NMOS transistor $15_2$ is set to the enhancement type, and the other NMOS transistors $15_3$–$15_m$ and $16_2$–$16_m$ are at the normally-off state. Even when the level of the output line 160 is changed, the level of any of the signal lines $20_2$–$20_m$ does not change. In contrast, when the level of the output line 150 becomes high, the enhancement type MOS transistor $15_2$ turns on to make the level of the signal line $20_2$ low so that the effective signal is transmitted. If the logic cell $11_0$ is a D type flip-flop, the input a is the D input and the output d is the $\overline{Q}$ output, the logic cell $11_0$ functions as a toggle type flip-flop to which a clock signal is supplied via the special signal line 201, and supplies through the output line 150 a signal which has been obtained by $\frac{1}{2}$-dividing the clock signal. Information on the signal line $20_2$ can be transmitted to the input 170 or 180 via the MOS transistor $17_2$ or $18_2$, and also can be transmitted to an adjacent logic block via the switch MOS transistor $22_2$ or $24_2$. When the information of the signal line $20_2$ is to be transmitted to the signal line $23_2$, for example, the switch MOS transistor $22_2$ may be ion-implanted to become a depletion type one, namely the normally-on state.

Summarizing the description above, in the MOS transistors on the input side of the logic cells $11_0$–$11_n$, the selected one(s) is an enhancement type MOS transistor, and the unselected ones are depletion type MOS transistors. In the MOS transistors on the output side of the logic cells, the selected one(s) is an enhancement type MOS transistor, and the unselected ones are NMOS transistors having a high threshold value.

The PLD of FIG. 1 has an advantage that the MOS transistors, excepting those used in the logic cells $11_0$–$11_n$, can be NMOS transistors. When the level of the inputs of the logic cells are low, however, all of the NMOS transistors constituting the circuit which supplies the input of low level (the unselected input circuit) are at the on-state to consume power. When considering the PLD as a whole, the number of such unselected circuits is very great as compared with the number of the selected input circuits, causing a disadvantage that the power consumption of the PLD of FIG. 1 is relatively large.

The transistors disposed at both the input and output sides of the logic cells may be PMOS transistors. In this case, the sources of the series-connected PMOS transistors at the input side are connected to the power supply, the one terminal of each of the load elements is grounded, the sources of the PMOS transistors in the output side of the logic cells are connected to the power supply, and the one terminal of each of the load elements $21_2$–$21_m$ is grounded.

Figure 3:
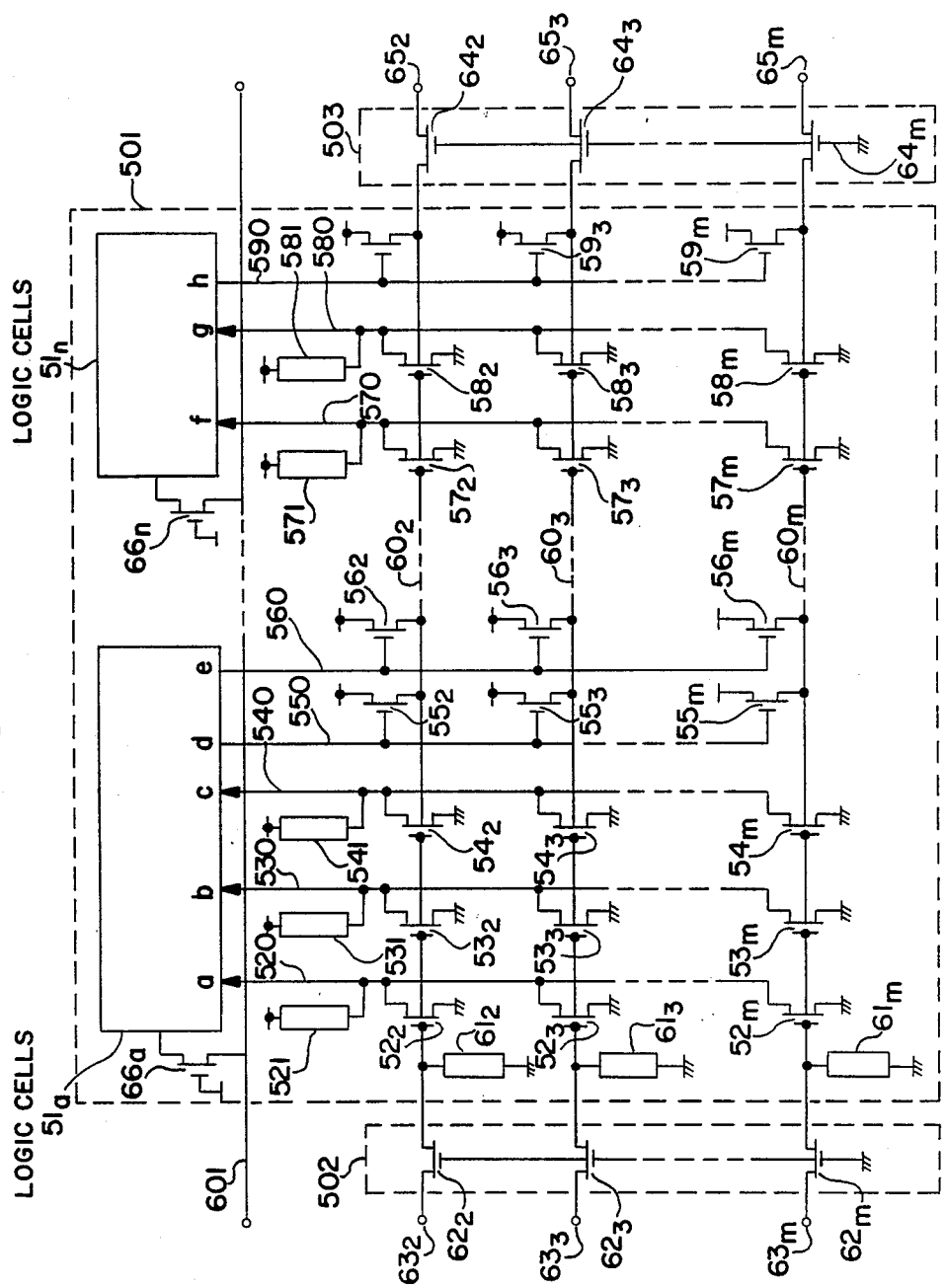
FIG. 3 is a circuit diagram of another PLD according to the invention.

FIG. 3 illustrates another embodiment of the PLD according to the invention. The PLD of FIG. 3 can solve the problem of the relatively large power consumption of the PLD of FIG. 1. The PLD of FIG. 3 comprises a logic block 501, and switch blocks 502 and 503 for setting the connections between the logic block 501 and other logic blocks (not shown). The MOS transistors shown in FIG. 3 are NMOS transistors except for the MOS transistors $55_2$–$55_m$, $56_2$–$56_m$ and $59_2$–$59_m$, and $51_0$–$51_n$ are logic cells.

The logic cell $51_0$ has three input lines 520, 530 and 540 to which three input circuits are respectively connected. The three input circuits comprise NMOS transistors $52_2$–$52_m$, $53_2$–$53_m$ and $54_2$–$54_m$, respectively. The sources of the NMOS transistors in the three input circuits are grounded. The drains of the NMOS transistors in each input circuit are connected to the input lines 520, 530 and 540, respectively. Namely, the NMOS transistors in each input circuit are connected in parallel to the input lines 520, 530 and 540. The gates of the NMOS transistors are connected to the signal lines $60_2$–$60_m$. The effective level of the signal lines $60_2$–$60_m$ is a high level, and the level of the signal lines when they are not selected is set low. Between the drain of each of the NMOS transistors $52_2$, $53_2$ and $54_2$ and the power source, load elements 521, 531 and 541 are provided, respectively.

Also provided are, special signal line 601, switch blocks 502 and 503 having NMOS transistors $62_2$–$62_m$ and $64_2$–$64_m$, and signal lines $63_2$–$63_m$ and $65_2$–$65_m$ which are constructed in similar to the corresponding parts of the PLD of FIG. 1.

Among the NMOS transistors $52_2$–$52_m$, $53_2$–$53_m$, $54_2$–$54_m$, $57_2$–$57_m$ and $58_2$–$58_m$ at the input side of the logic cells $51_0$–$51_n$, those which are unselected transistors are ion-implanted to have a high threshold level (i.e., to become the normally-off state), and selected transistors are of the enhancement type.

Among the PMOS transistors $55_2$–$55_m$, $56_2$–$56_m$ and $59_2$–$59_m$ the gates of which are connected to the outputs d, e and h of the logic cells $51_0$–$51_n$ through the output signal lines 550, 560 and 590, unselected transistors are ion-implanted to have a high negative threshold level (i.e., normally off state), and selected transistors are of the enhancement type.

For example, only the PMOS transistor $55_2$ is selected (the enhancement type), and the other PMOS transistors $55_3$–$55_m$ and $56_2$–$56_m$ are at the normally-off state. When the level of the output d becomes low, the enhancement type PMOS transistor $55_2$ turns on to make the level of the signal line $60_2$ high. And, the NMOS transistor $52_2$ is a selected transistor (enhancement type), and the other NMOS transistors $52_3$–$52_m$ of the same input circuit are unselected transistors (normally off). As described above, the level of the signal line $60_2$ becomes high. Hence, the NMOS transistor $52_2$ turns on to make the level of the input line 520 (which is normally high). If the logic cell $51_0$ is a D type flip-flop, the input a is the $\overline{D}$ input and the output d is the Q output, the logic cell $51_0$ functions as a toggle type flip-flop to which the special signal line 601 supplies a clock signal. In this case, the NMOS transistor $66_0$ is at the normally-on state. When all of the PMOS transistors connected transistors, the signal lines $60_2$–$60_m$ are at the low level because of the load elements $61_2$–$61_m$ one end of which is grounded.

Figure 4:
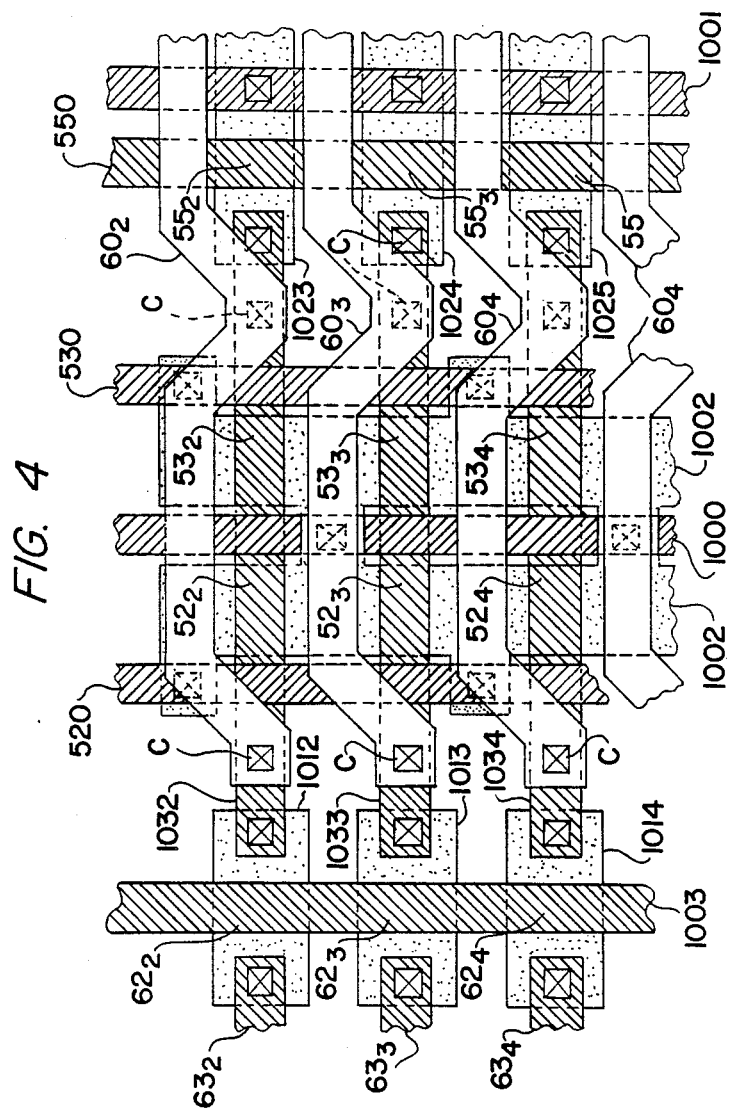
FIG. 4 illustrates a pattern layout of a portion of the PLD of FIG. 3.

FIG. 4 illustrates a part of the layout pattern of the PLD of FIG. 3. In FIG. 4, the switch block 502, and the input and output circuits for the logic cell $51_0$ are shown, but the input line 540 and output line 560 are not shown. The references 520, 532, 1000 and 1001 denote the first metal layer, 1002, 1012–1014 and 1023–1025 denote the diffusion layer, 550, 1003 and 1032–1034 denote the polysilicon layer, $60_2$–$60_5$ denote the second metal layer, and C denotes a contact hole. As shown in FIG. 4, the metal layer for connecting the MOS transistors therebetween or with other elements is not formed above the channels of the MOS transistors, thereby enabling the ion-implantation into the channels after the formation of the metal layer. Therefore, the number of the process steps which are to be conducted after the ion-implantation can be reduced.

In the PLDs of FIGS. 1 and 3, the switch blocks 102, 103, 502 and 503 may be formed by PMOS transistors. In this case, the gates of the PMOS transistors are connected to the power source. In the switch blocks, PMOS transistors and NMOS transistors may be mingled, or alternatively a parallel connection of an NMOS transistor and a PMOS transistor may be used as a switch. The NMOS transistors $26_0$–$26_n$ and $66_0$–$66_n$ for controlling the connection between the special signal lines 201, 601 and each logic cells may be replaced with PMOS transistors.

In the PLD of FIG. 3, the input circuits may consist of PMOS transistors, and the output circuits of NMOS transistors. In such circuitry, the sources of the parallel-connected PMOS transistors are connected to the power source, the one terminal of each of the load elements is grounded, the sources of the NMOS transistors in the output circuits are grounded, and the one terminal of each of the load elements $61_2$–$61_m$ is connected to the power source.

According to the invention, the number of photo-masks can be reduced, and the process time necessary after the metal steps can be greatly reduced, and therefore the PLDs of the invention can be manufactured in order to comply with a shortened delivery period requested by the market. Further, in the PLDs of the invention, more complex logics can be formed so that variety of logics can be obtained.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalent thereof by those skilled in the art to which this invention pertains.

What is claimed is:

1. A programmable logic device comprising:
   at least one logic cell having at least one input and at least one output;
   at least one input signal circuit for each of said at least one logic cell, said at least one input signal circuit having first MOS transistors connected in series, one end of each of said at least one input signal circuit being connected to at least one of said inputs of said at least one logic cell, the other end of each of said at least one input signal circuit being connected to one voltage level;
   signal lines, each of which interconnects the gates of corresponding ones of said MOS transistors;
   load elements connected between each of said signal lines and another voltage level; and
   at least one output signal circuit having second MOS transistors each of which is connected between another voltage level and one of said signal lines, respectively, the gates of said second MOS transistors being connected to said at least one output of said at least one logic cell.

2. A device according to claim 1, wherein said first and second MOS transistors are NMOS transistors.

3. A device according to claim 1, wherein said first and second MOS transistors are PMOS transistors.

4. A device according to claim 1, wherein said first and second MOS transistors are programmably conductive by means of ion implantation in their respective channels.

5. A device according to claim 1, wherein no metal layer is disposed above both said first and second MOS transistors.

6. A programmable logic device comprising:
   at least one logic cell having at least one input and at least one output;
   at least one input signal circuit for each of said at least one logic cell, said at least one input signal circuit having first MOS transistors of one type connected in parallel, one end of each of said at least one input signal circuit being connected to at least one of said input of said at least one logic cell, the other end of each of said input signal circuits being connected to one voltage level;
   signal lines, each of which interconnects the gates of corresponding ones of said first MOS transistors;
   load elements connected between each of said signal lines and another voltage level; and
   at least one output signal circuit having second MOS transistors of the opposite conductivity type, each of which is connected between another voltage level and one of said signal lines, respectively, the gates of said second MOS transistors being connected to said at least one output of said at least one logic cell.

7. A device according to claim 6, wherein said first MOS transistors are of the N-type, and said second MOS transistors are of the P-type.

8. A device according to claim 6, wherein said first MOS transistors are the P-type, and said second MOS transistors are the N-type.

9. A device according to claim 6, wherein said first and second MOS transistors are programmably conductive by means of ion implantation in their respective channels.

10. A device according to claim 6, wherein no metal layer is disposed above both said first and second MOS transistors, said first and second MOS transistors are programmably conductive by means of ion implantation in their respective channels.

* * * * *